United States Patent
Hourai et al.

(10) Patent No.: US 7,265,953 B2
(45) Date of Patent: Sep. 4, 2007

(54) POWER SUPPLY BOOST CONTROL DEVICE AND METHOD FOR IDENTIFYING AND JUDGING FAULT LOCATION IN POWER SUPPLY BOOST CONTROL DEVICE

(75) Inventors: Yasuharu Hourai, Utsunomiya (JP); Kenichi Yoshimura, Utsunomiya (JP)

(73) Assignee: Keihin Corporation, Tokyo (JP)

( * ) Notice: Subject to any disclaimer, the term of this patent is extended or adjusted under 35 U.S.C. 154(b) by 270 days.

(21) Appl. No.: 11/134,379

(22) Filed: May 23, 2005

(65) Prior Publication Data

US 2005/0265087 A1  Dec. 1, 2005

(30) Foreign Application Priority Data

May 31, 2004  (JP) ............................. 2004-162071

(51) Int. Cl.
*H01G 2/12* (2006.01)
(52) U.S. Cl. ..................................... 361/18; 361/159
(58) Field of Classification Search .................. 361/18, 361/159; 267/140.14
See application file for complete search history.

(56) References Cited

U.S. PATENT DOCUMENTS 4,999,775 A * 3/1991 Muraoka ...................... 701/34
6,034,856 A * 3/2000 Kather et al. .................. 361/87
6,724,313 B2 * 4/2004 Sato et al. ................... 340/590
7,023,152 B2 * 4/2006 Sunaga et al. ................ 318/34
7,025,342 B2 * 4/2006 Nemoto et al. ......... 267/140.14

FOREIGN PATENT DOCUMENTS

JP    11-308855    11/1999
JP    2000-125586    4/2000

* cited by examiner

*Primary Examiner*—Vu A. Le
(74) *Attorney, Agent, or Firm*—Squire, Sanders & Dempsey L.L.P.

(57) ABSTRACT

A power supply boost control device and a fault location identification and judgment method for the power supply boost control device of this invention comprise a step of judging whether a power supply relay has a turn-on fault, a precharge circuit has a turn-on fault, or the power supply relay has a turn-on fault; second judgment unit is comprised for judging whether a boosting prohibit function is faulty, or the precharge circuit has a turn-off fault, or the precharge circuit has a turn-off fault; and third judgment unit is comprised for judging, based on the judgment result of the first voltage judgment unit, whether or not the power supply relay has a turn-off fault.

5 Claims, 7 Drawing Sheets

POWER SUPPLY BOOST CONTROL DEVICE AND METHOD FOR IDENTIFYING AND JUDGING FAULT LOCATION IN POWER SUPPLY BOOST CONTROL DEVICE

BACKGROUND OF THE INVENTION

1. Field of the Invention

The present invention relates to a power supply boost control device and to a method for identifying and judging a fault location in a power supply boost control device.

Priority is claimed on Japanese Patent Application No. 2004-162071, filed May 31, 2004, the content of which is incorporated herein by reference.

2. Description of Related Art

In recent years, there have been proposed automobiles and other vehicles comprising a power supply boost control device which generates a high voltage, as the power supply for, for example, active control engine mounts and injectors.

Such power supply boost control devices execute feedback control to maintain a boosted voltage, which is a boosting circuit output, at a predetermined value. In cases where the boosted voltage fluctuates despite the execution of feedback control, the power supply boost control device is judged to be faulty. Japanese Unexamined Patent Application, First Publication, No. 2000-125586 discloses the use of a CPU to monitor the terminal voltage of a boosting circuit in order to improve the accuracy of detection of faults in such power supply boost control devices.

Power supply boost control devices generally adopt a switching boosting circuit; a smoothing capacitor with comparatively large capacitance is used within the boosting circuit. Hence large rush currents may occur when the power supply of the boosting circuit is turned on. Hence in order to prevent fusion at contact points due to such rush currents, Japanese Unexamined Patent Application, First Publication, No. H11-308855 describes the provision of a precharge circuit, to charge the smoothing capacitor with charge prior to turning on the power supply, so as to reduce the magnitude of the rush current.

As explained above, faults are judged in a power supply boost control device based on the output voltage of the boosting circuit. However, a precharge circuit or similar is connected further upstream than the boosting circuit, so that even if a fault is judged to have occurred, it is difficult to judge whether the fault is in the boosting circuit itself, or in the precharge circuit or another circuit other than the boosting circuit, and so there is the problem that the fault location cannot be identified.

If the power supply boost control device is activated and run continuously without being able to identify the fault location, there is the problem that the load on the power supply boost control device is increased.

Moreover, if a voltage judgment unit are provided for the precharge circuit and other circuits other than the boosting circuit in order to identify the fault location within the power supply boost control device, there is the problem that the circuit configuration is made complex.

SUMMARY OF THE INVENTION

Hence the present invention provides a power supply boost control device and method of identification and judgment of fault locations in power supply boost control devices, capable of identifying a fault location and reducing the load on the device.

In order to solve the above-described problems, according to the fault location identification and judgment method of a first aspect of the invention for a power supply boost control device comprising a power supply relay (for example, a power supply relay 8 in the preferred embodiment), a boosting circuit (for example, a boosting circuit 3 in the embodiment), and a precharge circuit (for example, a precharge circuit 4 in the embodiment), in a state in which a unit power supply is turned on, the power supply relay and the precharge circuit are turned off, and moreover the boosting circuit is controlled to prohibit boosting operation, a judgment is made as to whether the fault is a power supply relay turn-on fault, or a precharge circuit turn-on fault, based on the voltage on the upstream side of the boosting circuit;

upon a judgment that the fault is not a power supply relay turn-on fault, in a state in which the precharge circuit is forced to the on state, a judgment is made as to whether the boosting prohibition function of the boosting voltage is faulty or the precharge circuit has a turn-off fault, based on the voltage on the upstream side and the voltage on the downstream side of the boosting circuit; and, upon a judgment that the fault is not a precharge circuit turn-off fault, in a state in which the power supply relay is forced to the on state, a judgment is made as to whether the fault is a power supply relay turn-off fault based on the voltage on the upstream side of the boosting circuit.

By means of this configuration, a judgment is made as to whether a fault has occurred through control to turn portions on, in the order, from the time of turn-on of the unit power supply, of the boosting prohibition function of the boosting circuit; the precharge circuit; and the power supply relay.

In the fault location identification and judgment method of a second aspect of the invention, when judging whether there is a turn-on fault in the power supply relay or a turn-on fault in the precharge circuit, the voltage on the upstream side of the boosting circuit is again detected while consuming the power supplied to the side upstream of the boosting circuit.

By means of this configuration, it is possible to identify a fault as a turn-on fault of the power supply relay or as a turn-on fault of the precharge circuit merely by monitoring the voltage on the upstream side of the boosting circuit, without adding a separate circuit.

In a fault location identification and judgment method of a third aspect of the invention, when judging whether a fault is a boosting prohibition function fault of the boosting circuit or a turn-off fault of the precharge circuit, a judgment is made as to whether the boosting prohibition function is faulty when the boosting circuit steps up the voltage, and if the boosting circuit does not perform voltage boosting, a turn-off fault is judged to have occurred in the precharge circuit.

By means of this configuration, it is possible to identify a fault as a turn-off fault of the precharge circuit or as a boosting prohibition function fault of the boosting circuit merely by comparing the voltages on the downstream side and on the upstream side of the boosting circuit.

In a fault location identification and judgment method of a fourth aspect of the invention, when it is judged that there is no turn-off fault in the power supply relay, the boosting prohibition function is turned off, and based on the voltage on the downstream side of the boosting circuit, a judgment is made as to whether the boosting function of the boosting circuit is anomalously low or is anomalously high, or whether the boosting function is normal.

By means of this configuration, after confirming that there is no anomaly in the power supply relay and precharge circuit, the output of the boosting circuit is started, so that whether the fault is in the boosting circuit or is in a circuit other than the boosting circuit can be distinguished, and the fault location clarified.

A power supply boost control device of the present invention having a power supply relay, a boosting circuit and a precharge circuit, comprises a first switching unit (for example, a switching unit K1 in the embodiment) for turning on and off the precharge circuit, a second switching unit (for example, a switching unit K2 in the embodiment) for turning on and off the power supply relay, a third switching unit (for example, a switching unit K3 in the embodiment) for turning on and off the boosting circuit boosting prohibition function; a first voltage judgment unit (for example, a voltage judgment unit H1 in the embodiment) for judging the voltage on the upstream side of the boosting circuit, a second voltage judgment unit (for example, a voltage judgment unit H2 in the embodiment) for judging the voltage on the downstream side, a first fault judgment unit (for example, step S6 in the embodiment) for judging, when the first switching unit and second switching unit are switched to off and the third switching unit is switched to on, whether there is a turn-on fault in the power supply relay, a turn-on fault in the precharge circuit, or a turn-on fault in the power supply relay, based on the judgment result of the first voltage judgment unit, second fault judgment unit (for example, step S20 in the embodiment) for judging, when the first switching unit is switched on, based on the judgment result of the first voltage judgment unit, whether there is a fault in the boosting prohibition function or a turn-off fault in the precharge circuit, or whether there is a turn-off fault in the precharge circuit, and a third fault judgment unit (for example, step S30 in the embodiment) for judging, when the second switching unit is turned on, based on the judgment result of the first voltage judgment unit, whether there is a turn-off fault in the power supply relay.

In this specification, a "turn-on fault" is a fault in which, when the equipment is in the off state and an attempt is made to put the equipment into the on state, the equipment does not actually enter the on state; and a "turn-off fault" is a fault in which, when an attempt is made to turn off equipment in the on state, the equipment does not actually enter the off state.

DETAILED DESCRIPTION OF THE INVENTION

Figure 1:
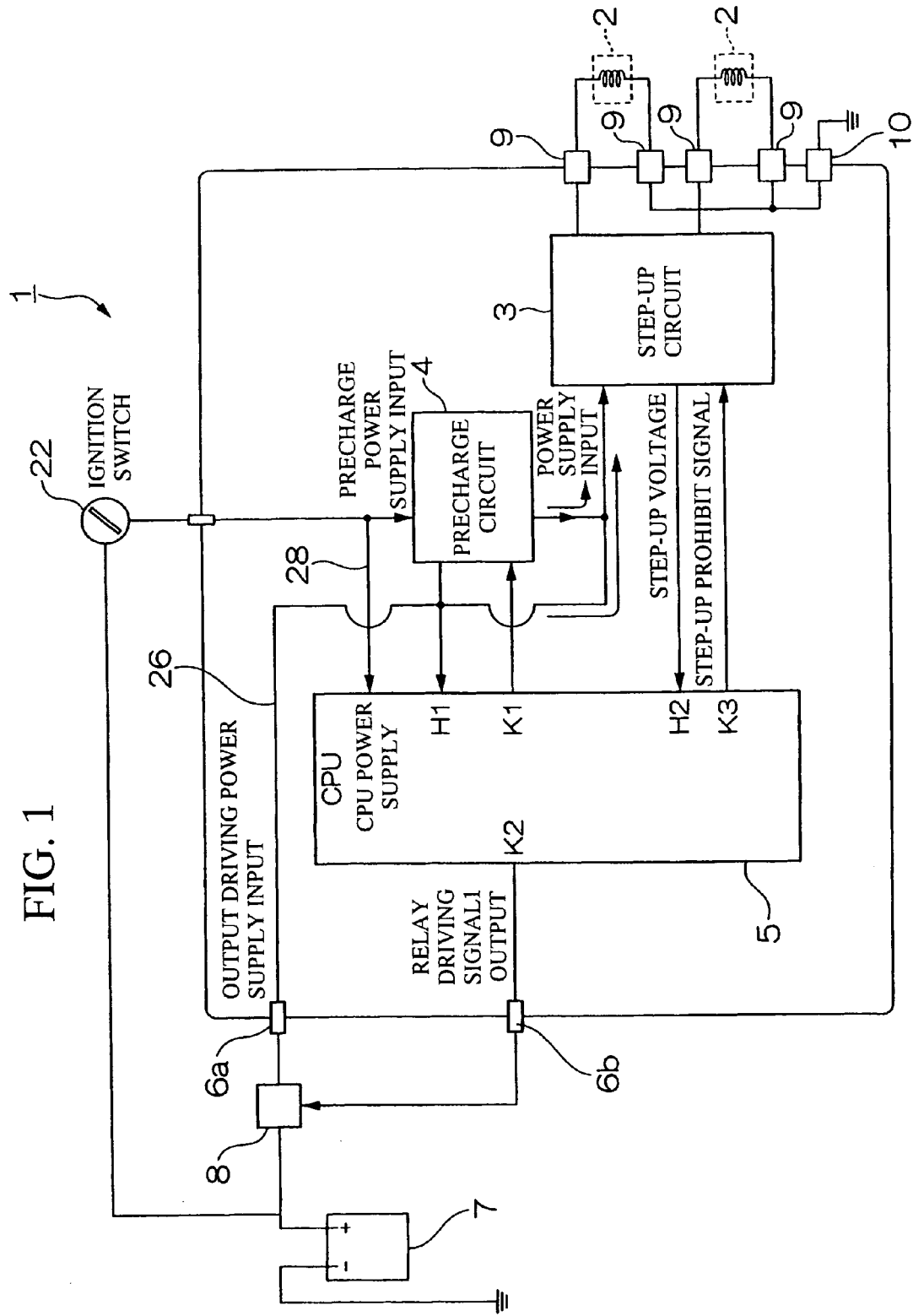
FIG. 1 is a block diagram showing the power supply boost control device according to an embodiment of the present invention.

A preferred embodiment of the present invention is explained below, referring to the drawings.

FIG. 1 shows an actuator driving control unit 1 (a power supply boost control device or boosting voltage control device) of an automobile or other vehicle according to an embodiment of the invention. The vehicle of this aspect is for example a hybrid vehicle which is capable of improving gas mileage by partially suspending cylinder operation during low engine revolution speeds. The actuator driving control unit 1 drives the electromagnetic actuator 2 of an active control engine mount (ACM), and comprises a boosting circuit 3, precharge circuit 4, and CPU 5.

The active control engine mount comprises an engine mount injected with oil or some other liquid, and applies pressure, in the opposite phase of vibrations of the engine, to the mount barrier of the engine, by means of the piston of the electromagnetic actuator 2. By this means, vibrations of the engine are dampened, and propagation of vibrations to the vehicle body is reduced.

The positive-side terminal of a battery (BATT) 7 which supplies power to the actuator driving control unit 1 is connected, via a power supply relay 8, to the power supply input terminal 6a of the actuator driving control unit 1. The power supply relay 8 turns on and off the connection between the actuator driving control unit 1 and the battery 7. The power supply relay 8 is connected, via the relay driving terminal 6b, to the CPU 5 having a switching unit K2 to control a relay coil, not shown. The power supply relay 8 is turned off when a voltage is applied to the relay coil.

The boosting circuit 3 is connected to the power supply input terminal 6a. The boosting circuit 3 is a so-called chopper-type boosting circuit, which boosts (steps up) and outputs the voltage of the battery 7. The output side of the boosting circuit 3 is connected, via the output terminal 9 of the actuator driving control unit 1, to two electromagnetic actuators 2, 2 connected in parallel, as output devices. The electromagnetic actuators 2, 2 are grounded at a single point via the ground terminal 10.

Figure 2:
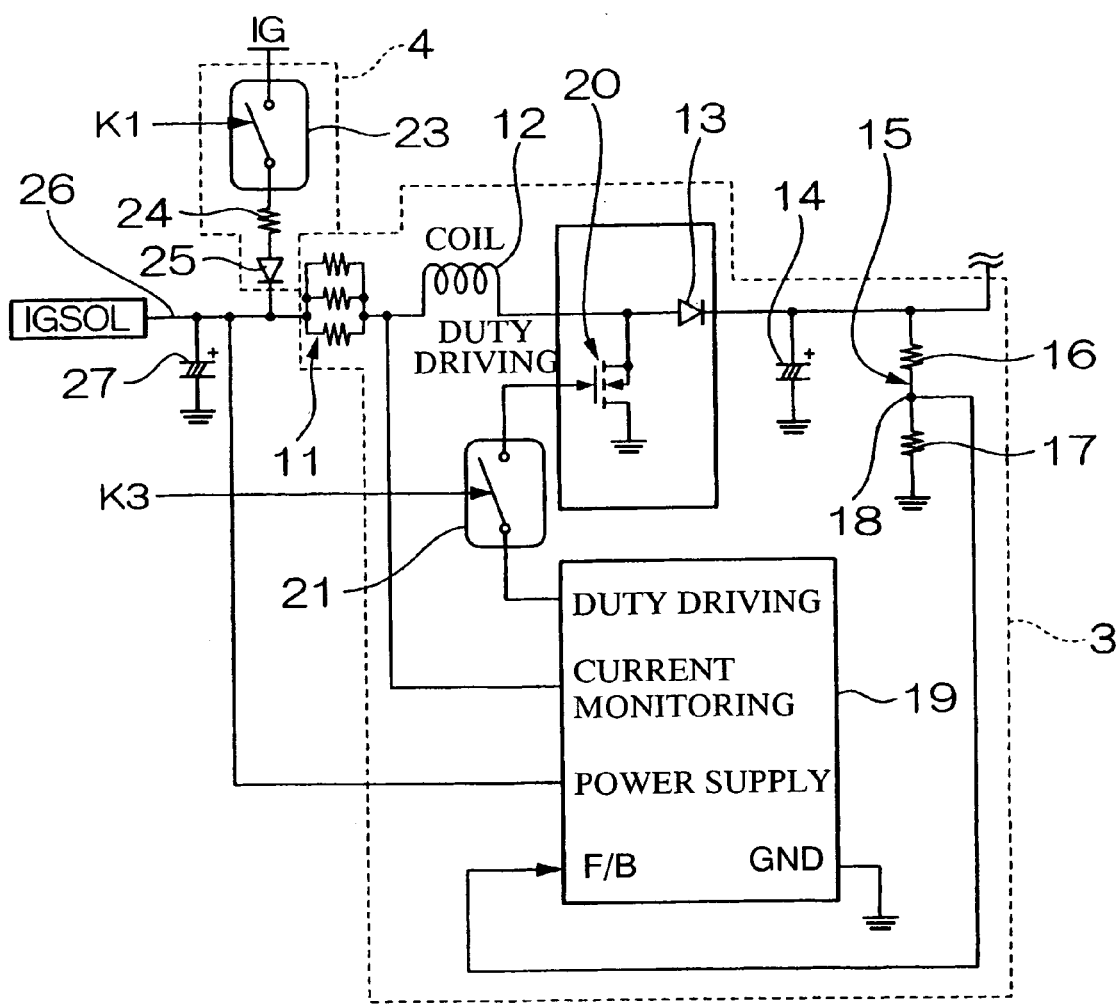
FIG. 2 is a circuit diagram showing a boosting circuit and a precharge circuit used in the power supply boost control device according to the embodiment of the present invention.

As shown in FIG. 2, within the boosting circuit 3 a limiting resistance 11, boosting coil 12, and rectifying diode 13 are connected in series from the power supply input terminal 6a toward the electromagnetic actuator 2. The rectifying diode 13 is connected such that the forward direction is from the boosting coil 12 toward the output terminal 9. The limiting resistance 11 limits the input current; three resistances are connected in series to secure a high withstand current.

A smoothing capacitor 14 is connected between the downstream side of the rectifying diode 13 and ground. The smoothing capacitor 14 is an element which determines the output voltage of the boosting circuit 3, and has a comparatively large capacitance. The smoothing capacitor 14 is connected in parallel with a voltage division circuit 15. The voltage division circuit 15 comprises two resistances 16 and 17 connected in series; a boosting IC 19 is connected to the point of connection 18 of the two resistances 16 and 17.

The source of a field effect transistor (FET) 20 is connected between the boosting coil 12 and the rectifying diode 13. The drain of the field effect transistor 20 is connected to ground, and the gate of the field effect transistor 20 is connected, via a switch 21, to the boosting IC 19. The switch 21 is connected to the above-described CPU 5; the switch 21 is turned on and off by the switching unit K3 of the CPU 5.

The boosting IC 19 executes feedback (F/B) control of the output voltage of the boosting circuit 3. The boosting IC 19, in addition to executing feedback control, also controls the duty driving of the field effect transistor 20 and monitors the current on the input side of the boosting circuit 3, and is supplied with power branched from the side of the boosting coil 12 of the limiting resistance 11. The boosting IC 19 is connected to ground (GND).

Operation of the chopper-type boosting circuit 3 is explained briefly. When the field effect transistor 20 is continuously turned on and off, a back electromotive force occurs in the boosting coil 12. The voltage arising due to this back electromotive force is added to the voltage of the battery 7. The added voltage is rectified by the rectifying diode 13, then smoothed by the smoothing capacitor 14, and output as a stepped-up voltage. Hence when the field effect transistor 20 is not turned on and off, the input voltage and output voltage of the boosting circuit 3 are substantially equal, and the more the period of the on/off operation of the field effect transistor 20 is shortened, the higher the output voltage of the boosting circuit 3 becomes.

As shown in FIG. 1, the precharge circuit 4 is connected to the upstream side, that is, the side of the power supply input terminal 6, of the boosting circuit 3. The precharge circuit 4 gradually applies a voltage in advance to the input side of the boosting circuit 3, and is connected to the battery 7 via the ignition switch 22, which is a unit power supply.

As shown in FIG. 2, the precharge circuit 4 is connected in series with the switch 23, limiting resistance 24, and diode 25. The switch 23 is controlled by the switching unit K1 of the above-described CPU 5. The diode 25 is placed with the forward direction from the limiting resistance 24 toward the boosting circuit 3, in order to prevent backflow of current from the input side of the boosting circuit 3.

Specifically, when the switching unit K1 turns the switch 23 on, the voltage of the battery 7 is applied to the power supply line 26 on the downstream side from the power supply relay 8, via the precharge circuit 4. The voltage of the battery 7 is also applied to the smoothing capacitor 14 of the boosting circuit 3 and to a smoothing capacitor 27 described below; but because the current flowing into the power supply line 26 from the precharge circuit 4 is limited by the limiting resistance 24, charge accumulates gradually in the smoothing capacitors 14 and 27. As a result, the surge current when the power supply relay 8 is turned on is suppressed.

The smoothing capacitor 27 is connected between ground and the power supply line 26, which is between the power supply input terminal 6a and the precharge circuit 4. This smoothing capacitor 27, like the smoothing capacitor 14 of the boosting circuit 19, has a comparatively large capacitance, in order to eliminate noise superimposed on the power supply of the boosting IC 19.

As shown in FIG. 1, the power supply line 28 branches and is connected to the CPU 5 from the precharge circuit 4 and the ignition switch 22. The power supply of the CPU 5 is supplied by the battery 7 via the ignition switch 22; even before the power supply relay 8 enters the on state, power can be supplied to the CPU 5. The upstream side of the boosting circuit 3 and the voltage dividing circuit of the boosting circuit 3 are connected to the CPU 5. The CPU 5 has a voltage judgment unit H1 for judging the voltage of the upstream side of the boosting circuit 3, that is, the voltage of the power supply line 26, and a voltage judgment unit H2 for judging the feedback voltage of the boosting circuit 3.

Next, unit power supply control processing is explained, referring to the flowcharts of FIG. 4 through FIG. 7.

First, in step S1, a judgment is made as to whether control is prohibited. If the judgment result is "YES" (control prohibited), processing advances to step S15; if the judgment result is "NO" (control not prohibited), processing advances to step S2. In step S2, a judgment is made as to whether the relay 8 has been diagnosed for a turn-on fault. If the judgment result is "YES" (diagnosis completed), processing advances to step S18, and if the judgment result is "NO" processing advances to step S3. In step S3, the switching unit K1 is turned off, in step S4, the switching unit K2 is turned off, in step S5, the switching unit K3 is turned on, and processing advances to step S6. On the other hand, in step S15, similarly to the above-described steps S3 to S5, the switching unit K1 is turned off, in step S16, the switching unit K2 is turned off, in step S17, the switching unit K3 is turned on, and processing returns.

In step S6 (a first judgment unit), a judgment is made as to whether the judgment result of the voltage judgment unit H1 is equal to or greater than a first stipulated value. If the judgment result is "YES" (greater than or equal to the first stipulated value), processing advances to step S8; if the judgment result is "NO" (less than the first stipulated value), processing advances to step S7. In step S7, a judgment is made as to whether the relay 8 has been diagnosed for a turn-on fault, and processing returns.

Here the first stipulated value is a voltage value which is somewhat higher than ground voltage (0 V), and lower than the voltage of the battery 7, and is a reference value for use in judging whether there is a voltage on the upstream side of the boosting circuit.

In step S8, a judgment is made as to whether a stipulated time has elapsed. If the judgment result is "YES" (stipulated time has elapsed), processing advances to step S9; if the judgment result is "NO", processing returns. In step S9, power supply voltage consumption processing for the solenoid (SOL) is performed, and processing advances to step S10.

The solenoid power supply voltage consumption processing is processing to temporarily drive the boosting circuit 3 so as to lower the voltage on the upstream side of the boosting circuit 3.

In step S10, a judgment is made as to whether the voltage judgment unit H1 is equal to or greater than a first stipulated value. If the judgment result is "YES" (equal to or greater than first stipulated value), processing advances to step S11; if the judgment result is "NO" (less than first stipulated value), processing advances to step S13. In step S11, the relay 8 is judged to have a turn-on fault, and in step S12, control is prohibited and processing returns. In step S13, the precharge circuit 4 is judged to have a turn-on fault, and in step S14, control is prohibited and processing returns.

Specifically, the precharge circuit 4 is current-limited by a limiting resistance. When the precharge circuit 4 has a turn-on fault and when the boosting circuit 3 is temporarily driven in step S9, the power supplied from the precharge circuit 4 is consumed in the boosting circuit 3, so that the precharge circuit 4 can no longer pass current. As a result, the voltage on the downstream side of the precharge circuit 4 drops. When, on the other hand, the relay 8 has a turn-on fault, current is passed directly from the battery 7, so that a state in which current flows in via the precharge circuit 4 does not occur, and there is no voltage drop on the upstream side of the boosting circuit 3.

Next, in step S18, a judgment is made as to whether the precharge circuit 4 has been diagnosed for a turn-on fault. If the judgment result is "YES" (precharge turn-on fault diagnosis completed), processing advances to step S19, and if the judgment result is "NO" (precharge turn-on fault diagnosis not completed), processing advances to step S28. In step S19, the switching unit K1 is turned on, and processing advances to step S20. In step S20 (a second judgment unit), a judgment is made as to whether the judgment result of the voltage judgment unit H1 is equal to or less than a second stipulated value. If the judgment result is "YES" (equal to or less than the second stipulated value), processing advances to step S21, and if the judgment result is "NO" (greater than the second stipulated value), processing advances to step S27, it is judged that a precharge fault diagnosis has been completed, and processing returns.

The second stipulated value is a voltage value lower than the voltage of the battery 7 (for example, approximately 70% of the battery voltage), and is a reference value used to confirm that precharging has been completed by the precharge circuit 4.

In step S21, a judgment is made as to whether a stipulated time has elapsed. If the judgment result is "YES" (stipulated time has elapsed), processing advances to step S22, and if the judgment result is "NO" (stipulated time has not elapsed), processing returns.

In step S22, a judgment is made as to whether the judgment result of the voltage judgment unit H2 is greater than the judgment result of the voltage judgment unit H1. If the judgment result is "YES" (judgment result of the voltage judgment unit H2>judgment result of the voltage judgment unit H1), processing advances to step S23, and if the judgment result is "NO" (judgment result of the voltage judgment unit H2≦judgment result of the voltage judgment unit H1), processing advances to step S25. In step S23, a boosting prohibit function fault is judged to have occurred, and in step S24 control is prohibited and processing returns. On the other hand, in step S25, it is judged that the precharge circuit 4 has a turn-off fault, and in step S26, control is prohibited, and processing returns.

Next, in step S28, a judgment is made as to whether the relay 8 has been diagnosed for a turn-off fault. If the judgment result is "YES" (relay turn-off fault diagnosis completed), processing advances to step S35, and if the judgment result is "NO" (relay turn-off fault diagnosis not completed), processing advances to step S29.

In step S29, the switching unit K2 is turned on, and processing advances to step S30.

In step S30 (a third judgment unit), a judgment is made as to whether the judgment result of the voltage judgment unit H1 is equal to or less than a third stipulated value. If the judgment result is "YES" (equal to or less than third stipulated value), processing advances to step S31, and if the judgment result is "NO" (greater than third stipulated value), processing advances to step S34, it is judged that a relay 8 turn-off diagnosis has been completed, and processing returns.

The third stipulated value is a voltage value somewhat lower than the voltage of the battery 7, and is a reference value used to confirm that the battery voltage has been applied on the upstream side of the boosting circuit 3.

In step S31, a judgment is made as to whether a stipulated time has elapsed. If the judgment result is "YES" (stipulated time has elapsed), processing advances to step S32, and if the judgment result is "NO" (stipulated time has not elapsed), processing returns.

In step S32, the relay 8 is judged to have a turn-off fault, and in step S33, control is prohibited and processing returns.

Next, in step S35, the switching unit K3 is turned off and processing advances to step S36. In step S36, a judgment is made as to whether the judgment result of the voltage judgment unit H2 is less than a fourth stipulated value. If the judgment result is "YES" (less than the fourth stipulated value) processing advances to step S37, and if the judgment result is "NO" (equal to or greater than the fourth stipulated value) processing advances to step S40.

The fourth stipulated value is the lower limit of fluctuations in the voltage on the downstream side of the boosting circuit 3, that is, the voltage after stepping-up.

In step S37, a judgment is made as to whether a stipulated time has elapsed. If the judgment result is "YES" (stipulated time has elapsed) processing advances to step S38, and if the judgment result is "NO" (stipulated time has not elapsed) processing returns.

In step S38, it is judged that there is a boosting function anomaly, that is, that the voltage after boosting is decreased, and in step S39, control is prohibited and processing returns.

On the other hand, in step S40, a judgment is made as to whether the voltage judgment unit H2 is greater than a fifth stipulated value. If the judgment result is "YES" (greater than the fifth stipulated value) processing advances to step S41, and if the judgment result is "NO" (less than or equal to the fifth stipulated value) processing returns.

The fifth stipulated value is the upper limit of fluctuations in the voltage after stepping-up, that is, the voltage on the downstream side of the boosting circuit 3.

In step S41, a judgment is made as to whether a stipulated time has elapsed. If the judgment result is "YES" (stipulated time has elapsed) processing advances to step S42, and if the judgment result is "NO" (stipulated time has not elapsed) processing returns. In step S42, there is judged to be a boosting function anomaly, and in step S43 control is prohibited and processing returns.

Figure 3:
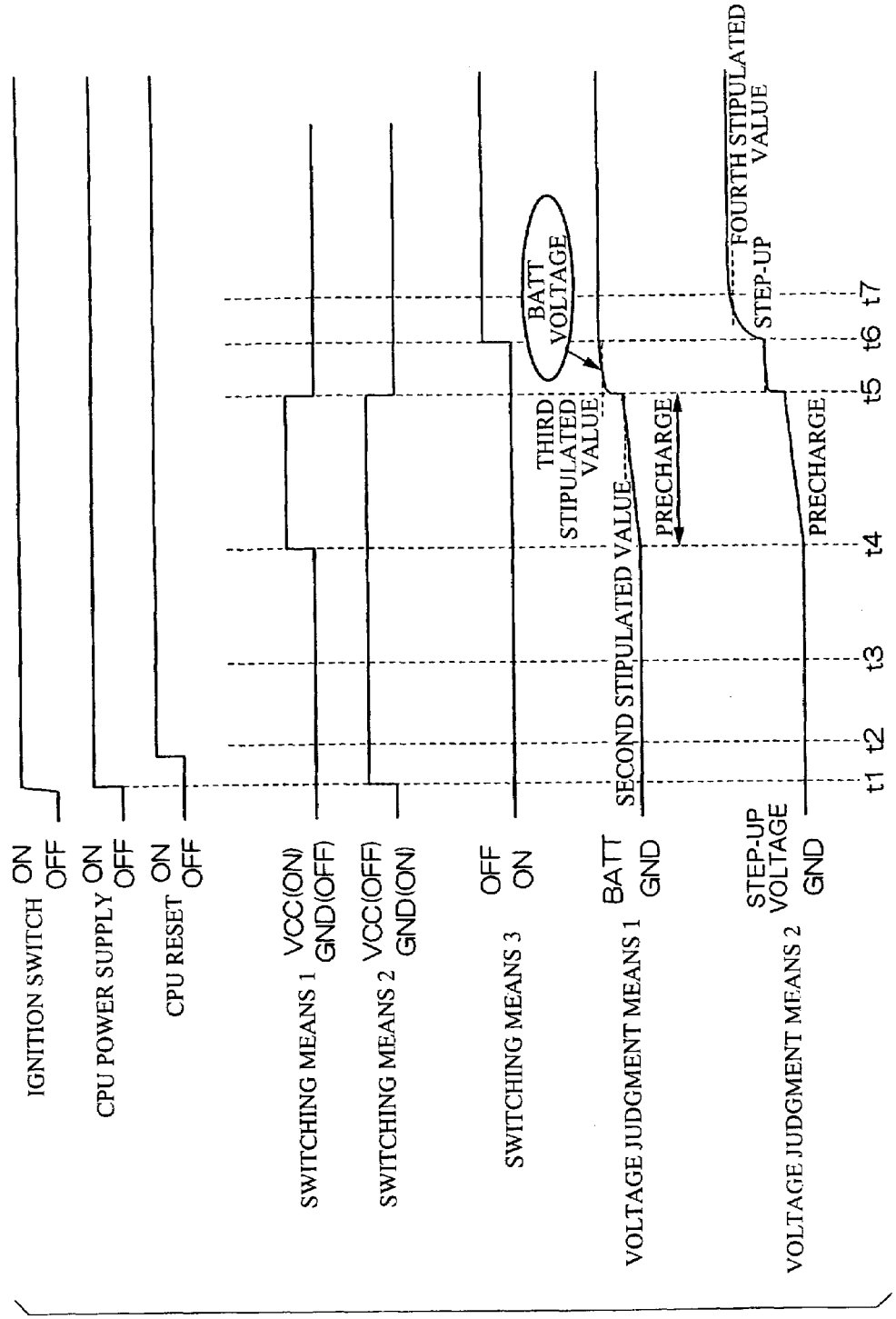
FIG. 3 is a timing chart showing the fault location identification and judgment control according to the embodiment of the present invention.
Figure 4:
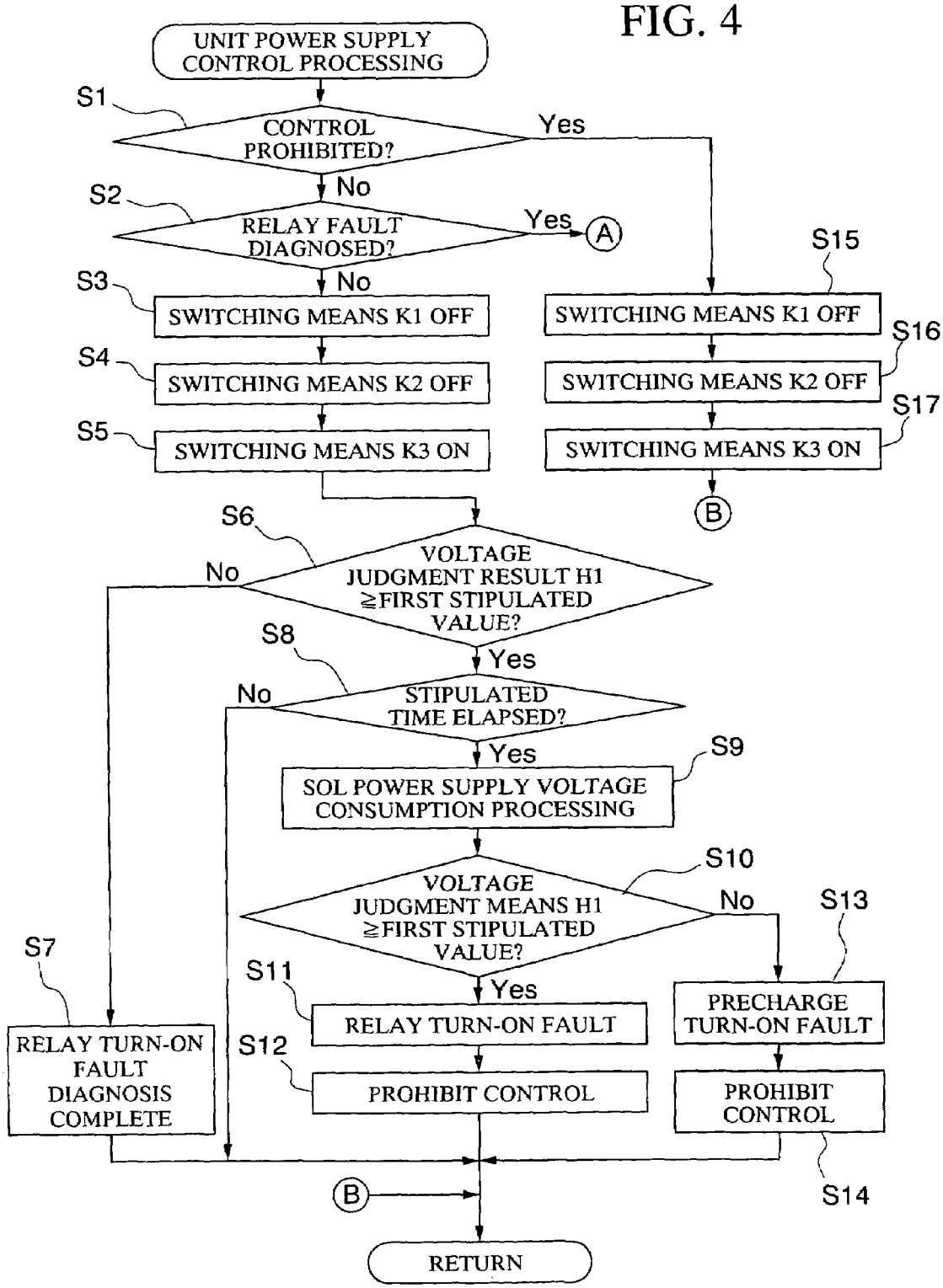
FIG. 4 is a flowchart showing the fault location identification and judgment control according to the embodiment of the present invention.
Figure 5:
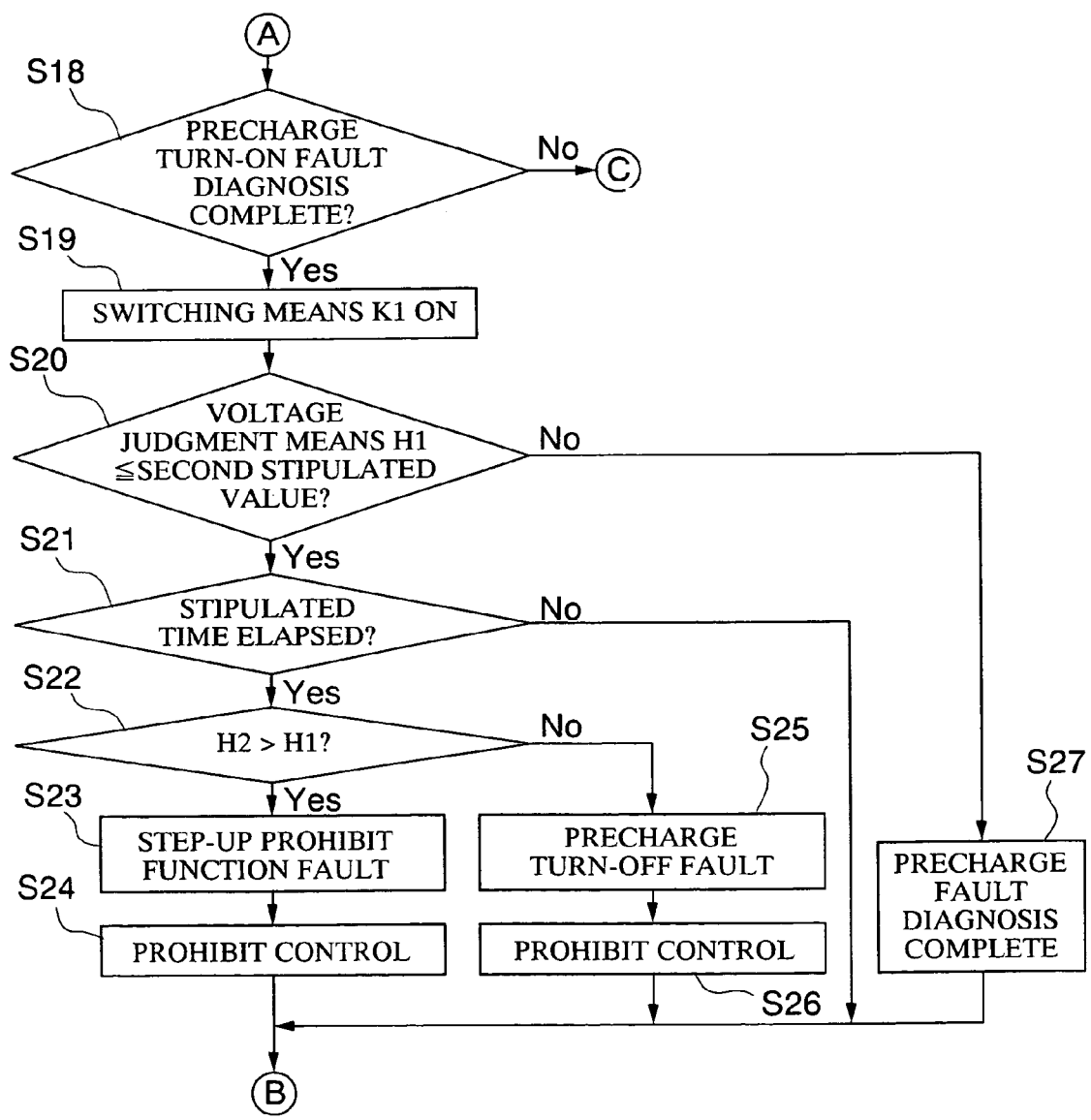
FIG. 5 is a flowchart showing the fault location identification and judgment control according to the embodiment of the present invention.
Figure 6:
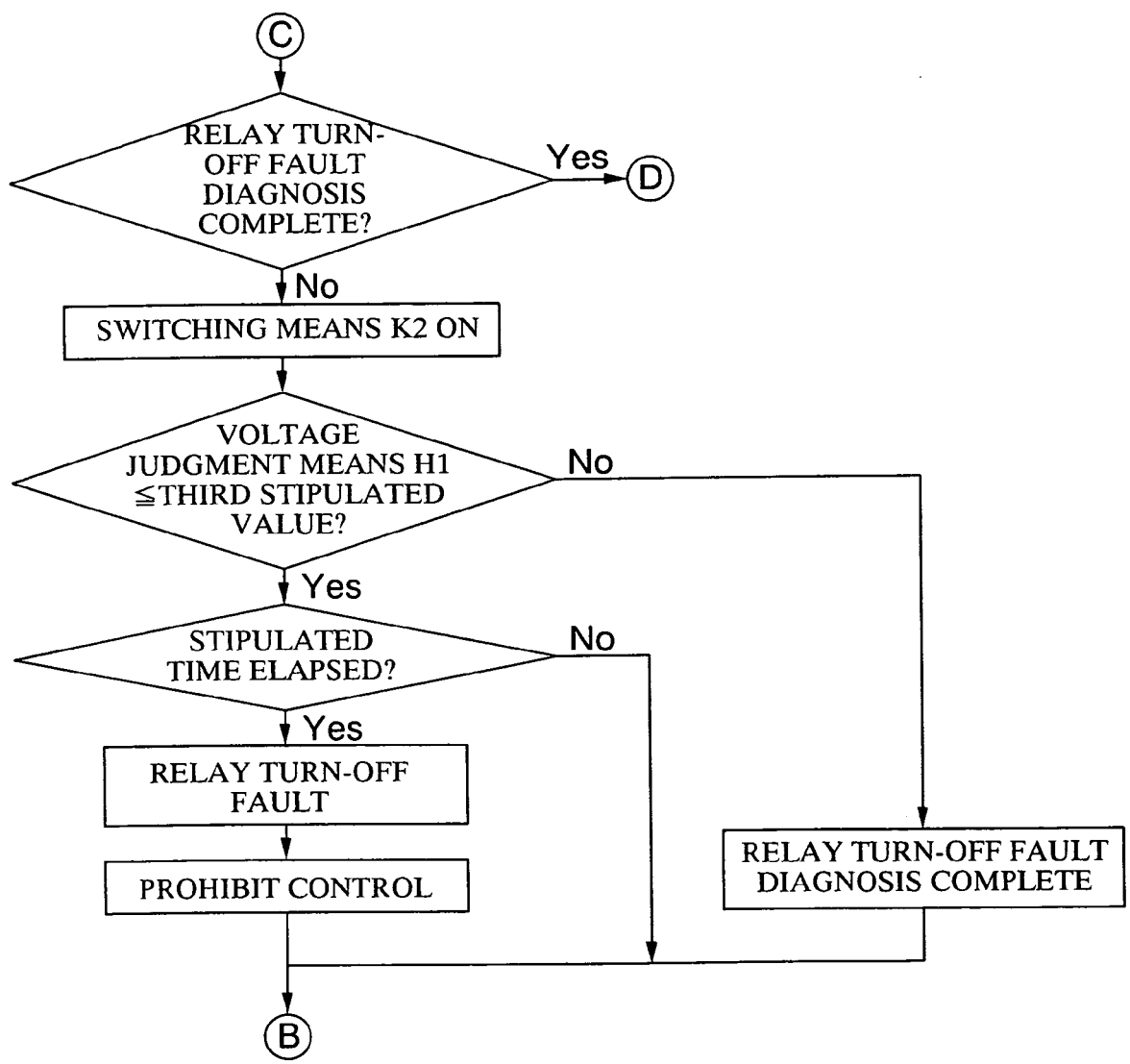
FIG. 6 is a flowchart showing the fault location identification and judgment control according to the embodiment of the present invention.
Figure 7:
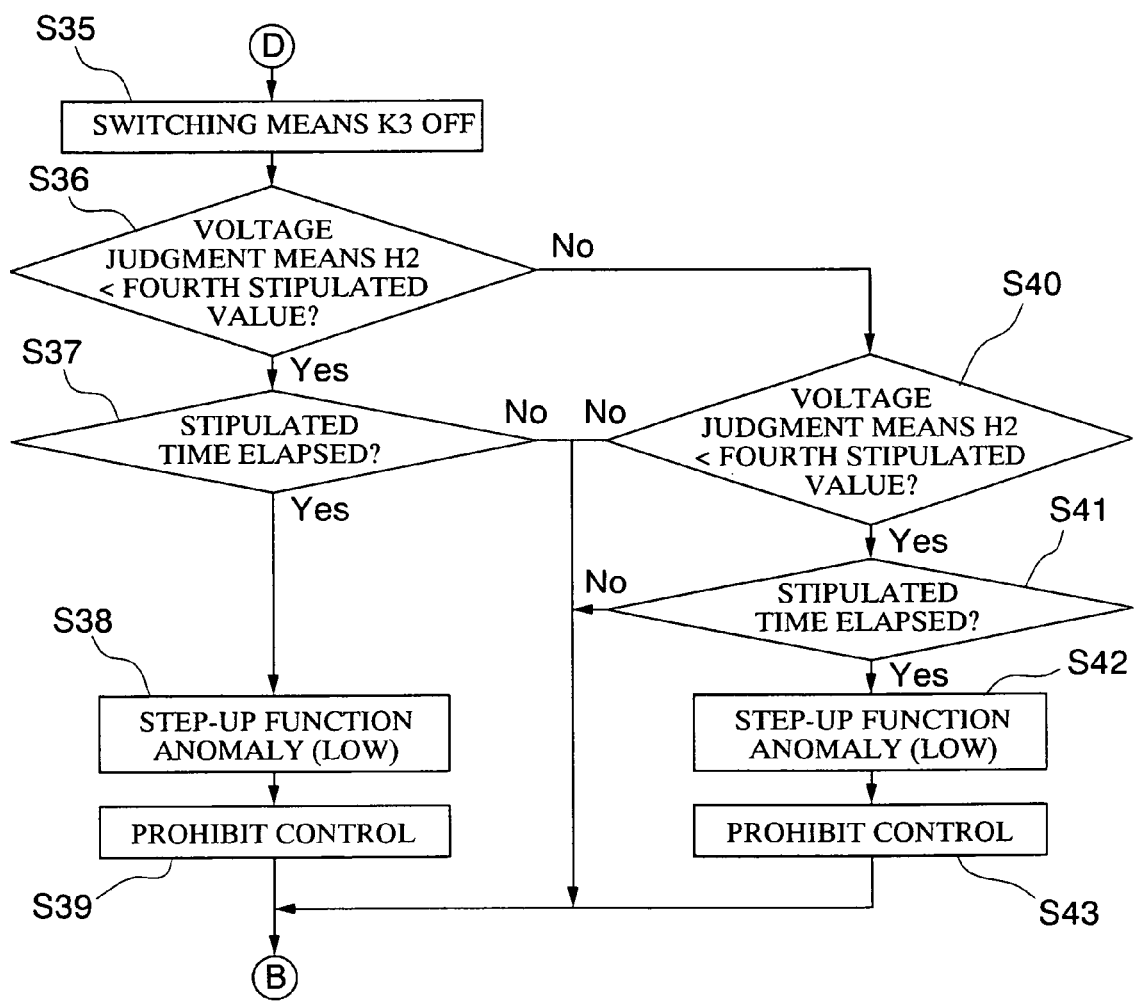
FIG. 7 is a flowchart showing the fault location identification and judgment control according to the embodiment of the present invention.

That is, as shown in the timing chart of FIG. 3, if a fault is discovered, when at time t1 the ignition switch (SW) 22 is turned on and the power supply of the CPU 5 is turned on, the switching unit K1 is turned off (step S3), the switching unit K2 is turned off (step S4), and the switching unit K3 is turned on (step S5). Then, at time t2 software processing by the CPU 5 enters an initial start (CPU reset on) state, and from time t3 diagnosis is initiated to determine whether the power supply (SOL) relay 8 has a turn-on fault or the precharge circuit 4 has a turn-on fault, or whether the power supply relay 8 has a turn-on fault (step S6).

At time t4, diagnosis is performed to determine whether the power supply relay 8 has a turn-on fault or the precharge circuit 4 has a turn-on fault, or whether the precharge circuit 4 has a turn-on fault. When as a result it is judged that the precharge circuit 4 does not have a turn-on fault ("NO" in step S6), the switching unit K1 is turned on (step S19), and a diagnosis is begun to determine whether the precharge circuit 4 has a turn-off fault or the boosting prohibit function of the boosting circuit 3 has a turn-on fault, or whether the precharge circuit 4 has a turn-off fault (step S20).

At this time, current flows from the battery 7 through the precharge circuit 4 into the smoothing capacitors 14 and 27, and the detected voltages of each, which are the judgment results of the voltage judgment unit H1 and the voltage judgment unit H2, rise gradually at the same rate. When it is judged that either the power supply relay 8 has a turn-on fault or that the precharge circuit 4 has a turn-on fault ("YES" in step S6), the boosting circuit 3 is temporarily driven to draw the voltage applied upstream of the boosting circuit 3 into the boosting circuit 3 (step S9), and then identification of either a turn-on fault in the power supply relay 8 or of a turn-on fault in the precharge circuit 4 is performed (step S10).

Next, at time t5, a diagnosis is performed to determine whether there is a boosting prohibit function fault or a turn-off fault in the precharge circuit 4, or whether there is a turn-off fault in the precharge circuit 4 (step S20). After confirming that there is no turn-off fault in the precharge circuit 4 ("NO" in step S20), the switching unit K1 is turned from on to off in order to isolate the precharge circuit 4, and the switching unit K2 is turned from off to on in order to turn on the power supply relay 8. That is, by turning on the switching unit K2, the voltage of the battery 7 is applied to the upstream side of the boosting circuit 3. Hence the voltages judged by the voltage judgment unit H1 and the voltage judgment unit H2 rapidly approach the voltage of the battery 7.

When a diagnosis determines that the boosting prohibit function is faulty or the precharge circuit 4 has a turn-off fault ("YES" in step S20), after a stipulated time has elapsed ("YES" in step S21), the input and output voltages of the boosting circuit 3 are compared based on the judgment results of the voltage judgment unit H1 and voltage judgment unit H2. If the boosting circuit 3 is stepping up the voltage, then the diagnosis determines that the boosting prohibit function is faulty; if the voltage is not being stepped up, it is determined that the precharge circuit 4 has a turn-off fault (step S22).

Next, between times t5 and t6, a diagnosis is performed to determine whether the power supply relay 8 does or does not have a turn-off fault. If, as a result of this diagnosis, it is determined that the power supply relay 8 does not have a turn-off fault ("NO" in step S30), the switching unit K3 is turned off in order to begin boosting by the boosting circuit 3 (step S35) at time t6. At time t7, the actuator driving control unit 1 is shifted into steady-state operation, and based on the judgment result of the voltage judgment unit H2, the voltage after boosting, which is the output of the boosting circuit 3, is constantly monitored to ensure the voltage remains within a stipulated range ("NO" in step S36, "NO" in step S40).

Hence by means of the above embodiment, after turning on the ignition switch 22 the switch 21 of the boosting prohibit function of the boosting circuit 3, the switch 23 of the precharge circuit 4, and the power supply relay 8 are turned on in order by the switching unit K3, the switching unit K1, and the switching unit K2 respectively, in order to detect faults in the switch 21 of the boosting circuit 3, in the switch 23 of the precharge circuit 4, and in the power supply relay 8. As a result, a faulty switch can be identified. When a fault is detected, control of the actuator driving control unit 1 can be halted immediately to lighten the load and to improve the reliability of the actuator driving control unit 1.

Because it is possible to identify a fault as a turn-on fault of the power supply relay 8 or as a turn-on fault of the precharge circuit 4 merely from the judgment result of the above voltage judgment unit H1, without adding a separate circuit for switch fault detection, the number of components can be decreased.

Further, simply by comparing the judgment results of voltage judgment unit H1 and voltage judgment unit H2, a fault can be identified as a turn-off fault of the precharge circuit 4 or as a boosting prohibit function fault of the boosting circuit 3, so that the amount of components can be decreased.

Because output from the boosting circuit 3 is initiated after first confirming that there are no anomalies in the power supply relay 8 or the switch 23 of the precharge circuit 4, a fault in the switch 21 of the boosting circuit 3 can be distinguished from a fault upstream from the boosting circuit 3 in the power supply relay 8 or in the switch 23 of the precharge circuit, and the fault location can be clarified, so that the reliability of the actuator driving control unit 1 can be improved.

Applications of this invention are not limited to that of the above embodiment, and if the device is a boosting voltage control device, application in for example an injector or other actuator driving control unit is possible. Use with an actuator other than an electromagnetic actuator, such as a piezoelectric element, is also possible.

As explained above, by means of this invention, after the unit power supply is turned on the boosting circuit boosting prohibit function, precharge circuit, and power supply relay are turned on in order to detect faults and enable identification of fault locations, so that the load on the boosting voltage control device can be reduced and reliability can be improved.

By means of the above embodiment of the invention, in addition to the above-described advantageous results, merely by monitoring the voltage on the upstream side of the boosting circuit without adding a separate circuit, a fault can be identified as a power supply relay turn-on fault or as a precharge circuit turn-on fault, so that the number of components can be decreased.

Further, by means of the above embodiment of the invention, in addition to the above-described advantageous results, merely by comparing the voltages on the downstream side and on the upstream side of the boosting circuit, a fault can be identified as a precharge circuit turn-off fault or as a boosting circuit boosting prohibit function fault, so that the number of components can be decreased.

Furthermore, by means of the above embodiment of the invention, in addition to the above-described advantageous results, after confirming that there are no anomalies in the power supply relay or in the precharge circuit, output from the boosting circuit is started, so that a fault in the boosting circuit can be distinguished from a fault in a circuit other than the boosting circuit, and the fault location can be clarified; hence there is the advantageous result that the reliability of the boosting voltage control device can be improved.

As described above, according to the power supply boost control circuit of this invention, the load on the boosting voltage control device can be reduced, and reliability can be improved.

While preferred embodiment of the invention has been described and illustrated above, it should be understood that this is an exemplary of the invention and is not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A fault location identification and judgment method for a power supply boost control device having a power supply relay, a boosting circuit, and a precharge circuit, comprising the steps of:

judging whether or not said power supply relay has a turn-on fault or said precharge circuit has a turn-on fault based on the voltage on the upstream side of said boosting circuit in a state in which the unit power supply is turned on, said power supply relay and said precharge circuit are turned off, and voltage boosting by said boosting circuit is prohibited;

when said power supply relay is judged not to have a turn-on fault, judging whether or not said precharge circuit has a turn-off fault or the boosting prohibit function of said boosting circuit is faulty based on the voltage on the upstream side and the voltage on the downstream side of said boosting circuit in a state in which said precharge circuit is turned on; and when said precharge circuit is judged not to have a turn-off fault, judging whether or not said power supply relay has a turn-off fault based on the voltage on the upstream side of said boosting circuit in a state in which said power supply relay is turned on.

2. The fault location identification and judgment method for a power supply boost control device according to claim 1, wherein, said step of judging whether or not said power supply relay has a turn-on fault or said precharge circuit has a turn-on fault is made by detecting the voltage on the upstream side of said boosting circuit while consuming power supplied to the upstream side of said boosting circuit.

3. The fault location identification and judgment method for a power supply boost control device according to claim 1, wherein said step of judging whether or not said precharge circuit has a turn-off fault or the boosting prohibit function of said boosting circuit is faulty is carried out by judging said boosting prohibit function is faulty if said boosting circuit is boosting the voltage, and by judging said precharge circuit has a turn-off fault if said boosting circuit is not boosting the voltage.

4. The fault location identification and judgment method for a power supply boost control device according to claim 1, further comprising the step of when said power supply relay is judged not to have a turn-off fault, judging whether the boosting function of said boosting circuit is anomalously low or is anomalously high, or said boosting function is normal, based on the voltage on the downstream side of said boosting circuit in a state in which said boosting prohibit function is turned off.

5. A power supply boost control device provided with a power supply relay, a boosting circuit and a precharge circuit, comprising:

a first switching unit which turns on and off said precharge circuit, a second switching unit which turns on and off said power supply relay, and a third switching unit which turns on and off a boosting prohibit function of said boosting circuit;

a first voltage judgment unit which judges the voltage on the upstream side of said boosting circuit, and second voltage judgment unit which judges the voltage on the downstream side of said boosting circuit;

a first fault judgment unit which judges, when said first switching unit turns off said precharge circuit, said second switching unit turns off said power supply relay and, said third switching unit turns on said boosting prohibit function of said boosting circuit, whether said power supply relay has a turn-on fault or said precharge circuit has a turn-on fault based on the judgment result of said first voltage judgment unit;

a second fault judgment unit which judges, when said first switching unit turns on said precharge circuit, whether said boosting prohibit function is faulty or said precharge circuit has a turn-off fault based on the judgment result of said first voltage judgment unit; and a third fault judgment unit which judges, when said second switching unit turns on said power supply relay, whether said power supply relay has a turn-off fault based on the judgment result of said first voltage judgment unit.

* * * * *